(12) United States Patent
Won et al.

(10) Patent No.: US 11,322,325 B2
(45) Date of Patent: May 3, 2022

(54) POWER RELAY ASSEMBLY

(71) Applicant: AMOGREENTECH CO., LTD., Gimpo-si (KR)

(72) Inventors: Min Ho Won, Incheon (KR); Seung Jae Hwang, Incheon (KR)

(73) Assignee: Amogreentech Co., Ltd., Gimpo-si (KR)

( * ) Notice: Subject to any disclaimer, the term of this patent is extended or adjusted under 35 U.S.C. 154(b) by 0 days.

(21) Appl. No.: 16/467,598

(22) PCT Filed: Dec. 14, 2017

(86) PCT No.: PCT/KR2017/014729
§ 371 (c)(1),
(2) Date: Jun. 7, 2019

(87) PCT Pub. No.: WO2018/111001
PCT Pub. Date: Jun. 21, 2018

(65) Prior Publication Data
US 2020/0037436 A1    Jan. 30, 2020

(30) Foreign Application Priority Data

Dec. 15, 2016  (KR) .................. 10-2016-0171568

(51) Int. Cl.
*H01H 45/12* (2006.01)
*H01H 45/04* (2006.01)
(Continued)

(52) U.S. Cl.
CPC ............. *H01H 45/12* (2013.01); *B60R 16/02* (2013.01); *H01H 45/04* (2013.01); *H02B 1/46* (2013.01);
(Continued)

(58) Field of Classification Search
CPC ........ H05K 1/00–1/0212; H05K 7/205; H05K 2201/10272; H05K 1/181; H05K 3/303;
(Continued)

(56) References Cited

U.S. PATENT DOCUMENTS 4,133,101 A * 1/1979 Glover .................... B23P 11/00
264/156
4,972,295 A  11/1990 Suguro et al.
(Continued)

FOREIGN PATENT DOCUMENTS

JP  H04137431 U  12/1992
JP  H08223739 A  8/1996
(Continued)

OTHER PUBLICATIONS

Soo, English translation of KR 20120106665, High polymer application aluminium busbar and switchgear, Sep. 2012 (Year: 2012).*

*Primary Examiner* — Zachary Pape
*Assistant Examiner* — Amir A Jalali
(74) *Attorney, Agent, or Firm* — Rothwell, Figg, Ernst & Manbeck, P.C.

(57) ABSTRACT

A power relay assembly is provided. A power relay assembly according to an exemplary embodiment of the present invention comprises: a support plate having at least one electric element mounted on one surface thereof and including a plastic material having heat dissipation and insulation properties; and at least one bus bar electrically connected to the electric element and partially embedded in the support plate. Due to these features, since heat generated from the bus bar and the electric element is dissipated to the outside through the support plate, it is possible to prevent performance deterioration due to heat and breakage of electronic components.

6 Claims, 7 Drawing Sheets

(51) Int. Cl.
  *B60R 16/02* (2006.01)
  *H02B 1/46* (2006.01)
  *H05K 1/02* (2006.01)
  *H05K 1/18* (2006.01)
  *H02G 5/06* (2006.01)
  *B60R 16/023* (2006.01)
  *H05K 1/03* (2006.01)

(52) U.S. Cl.
  CPC ............. *H02G 5/06* (2013.01); *H05K 1/0207* (2013.01); *H05K 1/0209* (2013.01); *H05K 1/181* (2013.01); *B60R 16/0238* (2013.01); *B60Y 2200/91* (2013.01); *H05K 1/0373* (2013.01); *H05K 2201/0129* (2013.01); *H05K 2201/10022* (2013.01); *H05K 2201/10053* (2013.01); *H05K 2201/10151* (2013.01); *H05K 2201/10181* (2013.01)

(58) Field of Classification Search
  CPC ..... H05K 2201/06; H05K 2201/10409; H05K 2201/10416; H01H 50/00–12; H01H 45/00–12; H01H 50/021; B60R 16/02; H02B 1/46; H02G 5/06; H05B 3/86; H05B 3/34; B32B 17/10036
  USPC ......... 361/704, 719–722; 174/252, 547, 713, 174/720
  See application file for complete search history.

(56) References Cited

U.S. PATENT DOCUMENTS

| | | | | |
|---|---|---|---|---|
| 5,422,440 | A * | 6/1995 | Palma | H02G 5/005 174/133 B |
| 6,270,361 | B1 * | 8/2001 | Onizuka | H01R 9/226 439/76.2 |
| 2002/0030036 | A1 * | 3/2002 | Kasai | H05K 7/026 219/56.22 |
| 2002/0050375 | A1 * | 5/2002 | Sumida | B60R 16/0238 174/50 |
| 2007/0010123 | A1 * | 1/2007 | Ikeda | H01H 50/048 439/374 |
| 2008/0080154 | A1 * | 4/2008 | Tagano | H05K 3/3447 361/775 |
| 2009/0009978 | A1 | 1/2009 | Fujimaki | |
| 2009/0272731 | A1 * | 11/2009 | Olding | C08L 81/02 219/482 |
| 2010/0037936 | A1 * | 2/2010 | Becker | H01L 31/048 136/248 |
| 2011/0005826 | A1 | 1/2011 | Hashikura et al. | |
| 2015/0373836 | A1 * | 12/2015 | Masutani | H01L 23/552 361/783 |
| 2016/0234928 | A1 * | 8/2016 | Nakamura | H05K 1/181 |
| 2016/0242275 | A1 * | 8/2016 | Nakamura | H05K 1/115 |
| 2017/0257949 | A1 * | 9/2017 | Bordonado | H01R 11/28 |
| 2018/0027646 | A1 * | 1/2018 | Sumida | H05K 7/20854 361/720 |
| 2020/0154528 | A1 * | 5/2020 | Gima | H05B 3/86 |

FOREIGN PATENT DOCUMENTS

| | | | | |
|---|---|---|---|---|
| JP | H08275338 | A | 10/1996 | |
| JP | 2000115956 | A | 4/2000 | |
| JP | 2002171050 | A | 6/2002 | |
| JP | 2005006365 | A | 1/2005 | |
| JP | 2005142256 | A | 6/2005 | |
| JP | 2005295723 | A | 10/2005 | |
| JP | 2006187122 | A | 7/2006 | |
| JP | 2008178240 | A | 7/2008 | |
| JP | 2009033088 | A | 2/2009 | |
| KR | 20120106665 | * | 9/2012 | ............ H01B 1/023 |
| KR | 101297487 | B1 | 8/2013 | |
| KR | 20140095320 | A | 8/2014 | |
| WO | 2009069308 | A1 | 4/2011 | |
| WO | 2016114099 | A1 | 7/2016 | |

\* cited by examiner

POWER RELAY ASSEMBLY

CROSS REFERENCE TO RELATED APPLICATION

This application is a 35 U.S.C. 371 National Phase Entry Application from PCT/KR2017/014729, filed Dec. 14, 2017, which claims the benefit of Korean Patent Application No. 10-2016-0171568 filed on Dec. 15, 2016, the disclosures of which are incorporated herein in their entirety by reference.

TECHNICAL FIELD

The present invention relates to a power relay assembly, and more specifically, to a power relay assembly usable in an electric vehicle, for example.

BACKGROUND ART

An electric vehicle is a generic term for vehicles driven using electricity. Generally, electric vehicles are classified into electric vehicles (EV) driven by only electricity, hybrid electric vehicles (HEV) using electricity and fossil fuel, and the like.

In an electric vehicle, a power relay assembly is located between a high-voltage battery and a motor. The above-described power relay assembly serves to selectively supply power from the high-voltage battery.

That is, the power relay assembly includes a main relay, a pre-charge relay, a pre-charge resistor, and the like, and the above-described components are electrically connected to each other through a bus bar.

The main relay supplies or blocks the power between the high-voltage battery and the motor, and the pre-charge relay and the pre-charge resistor prevents damage to an apparatus due to initial currents.

Further, the bus bar is a conductor having low impedance and a large current capacity and can individually connect at least two circuits or can connect several isoquant points in one system.

Generally, the power relay assembly is installed in a trunk or a cabin room in order to be connected to the high-voltage battery installed in the trunk. Accordingly, heat dissipation performance of the main relay or the pre-charge relay should be secured to prevent performance degradation and damage due to heat.

DISCLOSURE

Technical Problem

The present invention is directed to providing a power relay assembly capable of securing a heat dissipation performance.

Further, the present invention is directed to providing a power relay assembly in which a separate fixing member configured to fix a bus bar is unnecessary, thereby improving work productivity.

Technical Solution

One aspect of the present invention provides a power relay assembly including: a supporting plate having at least one electric element mounted on one surface thereof and including a plastic material having a heat dissipation property and an insulation property; and at least one bus bar electrically connected to the electric element and including a portion thereof buried in the supporting plate.

Further, the bus bar may be disposed so that at least a portion of the portion buried in the supporting plate comes into contact with a portion of the supporting plate formed of the plastic material having a heat dissipation property and an insulation property.

In addition, the bus bar may include a first portion buried in the supporting plate, a second portion configured to extend from an end portion of the first portion along a thickness direction of the supporting plate, and a third portion configured to extend from the second portion to protrude toward an outer side of the supporting plate.

In addition, the supporting plate may include a first plate in surface contact with one surface of the first portion of the bus bar, and a second plate and a third plate each having an arrangement hole of a shape corresponding to the portion of the bus bar buried in the supporting plate and sequentially stacked on one surface of the first plate.

In these circumstances, at least the first plate among the first plate, the second plate, and the third plate may be formed of plastic having a heat dissipation property and an insulation property or all of the first plate, the second plate, and the third plate may be formed of a plastic material having a heat dissipation property and an insulation property.

Alternatively, the supporting plate may be integrated with a portion of the bus bar buried therein through a resin-forming composition having a heat dissipation property and an insulation property and formed by insert-molding.

Further, the supporting plate may include a plate-shaped metal member disposed to be spaced apart from a lower side of the portion of the bus bar buried in the supporting plate at an interval. In these circumstances, the metal member may be disposed to be completely buried inside the supporting plate and the metal member may be fixed to one surface of the supporting plate so that one surface thereof is exposed to the outside. Preferably, the metal member may be disposed on the supporting plate to have an interval of 1 mm or more from the portion of the bus bar buried in the supporting plate.

In addition, a fine groove configured to improve bonding strength with the supporting plate may be formed on a surface of the metal member.

In addition, a heat transfer material may be interposed between facing surfaces of the metal member and the supporting plate.

In addition, a coating layer having an insulation property and a heat dissipation property may be formed on an exposed surface thereof in the above-described power relay assembly.

In addition, the bus bar may be formed of a conductive metal material. As an example, the bus bar may be formed of an aluminum material and include a coating layer having an insulation property and a heat dissipation property formed on a surface thereof.

In addition, the present invention may include at least one cover configured to prevent exposure of the bus bar to the outside, wherein at least a portion of the cover may be formed of a plastic material having a heat dissipation property and an insulation property.

Advantageous Effects

According to the present invention, a supporting plate configured to fix bus bars can have a heat dissipation property. Since heat generated from the bus bars can be quickly dispersed through the supporting plate, performance degradation and damage of components due to the heat can be prevented in advance.

Further, in the present invention, since portions of the bus bars configured to electrically connect electric elements are fixed to the supporting plate in a buried state, a separate fastening process for fixing the bus bars are unnecessary and thus various shaped bus bars can be used. Accordingly, the degree of design freedom can be increased.

MODES OF THE INVENTION

Figure 1:
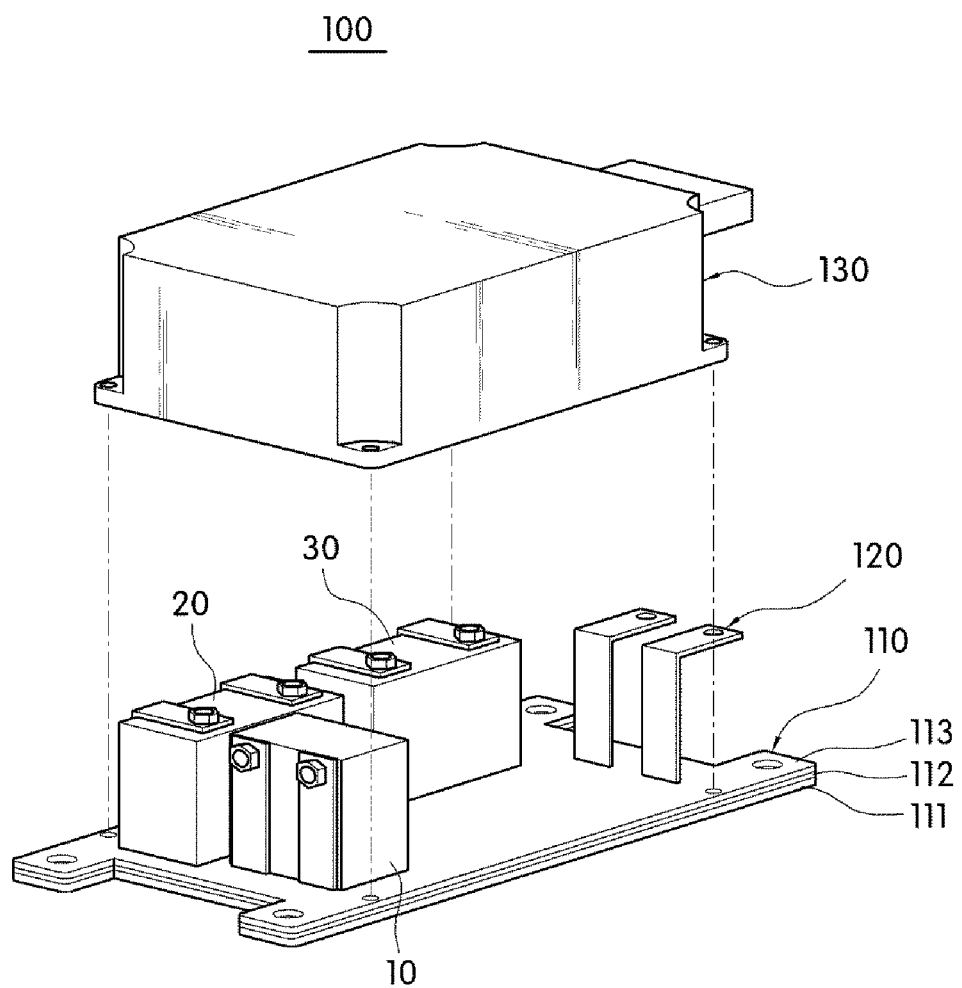
FIG. 1 is a schematic view illustrating a power relay assembly according to an embodiment of the present invention.
Figure 2:
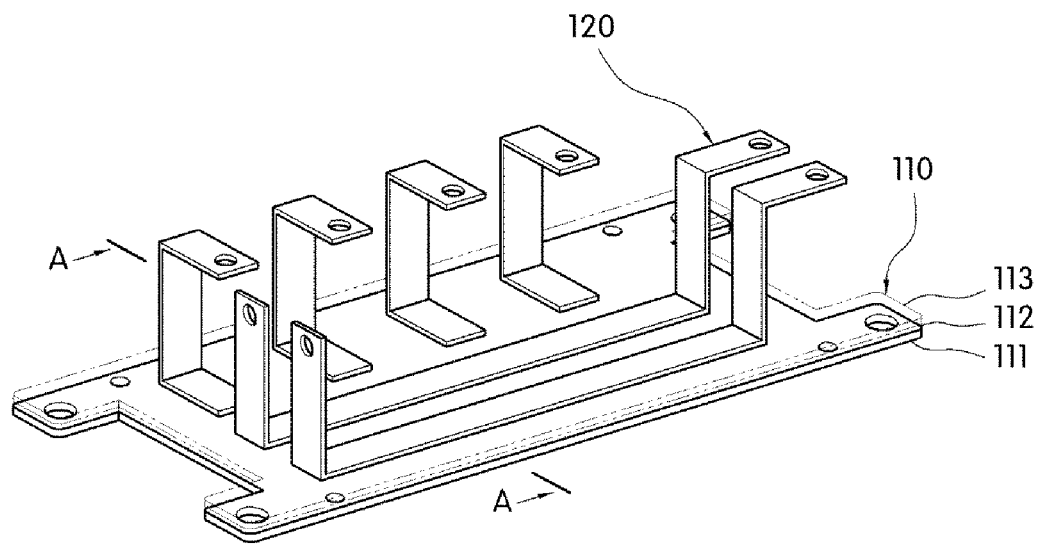
FIG. 2 is a view illustrating a state in which electric elements are removed in FIG. 1 and is a view illustrating an arrangement relation of bus bars.

Hereinafter, exemplary embodiments of the present invention will be described in detail with reference to the accompanying drawings which may allow one of ordinary skill in the art to easily perform the present invention. The present invention may be implemented in various forms and is not limited to the following embodiments. Components not related to the description are not included in the drawings to clearly describe the present invention, and the same reference symbols are used for the same or similar components in the description.

A power relay assembly 100 according to an embodiment of the present invention is provided to supply power to a driving control part configured to block or connect high-voltage currents supplied from a battery to control a driving voltage, and as shown in FIGS. 1 to 4, includes a supporting plate 110 and at least one electric element 10, 20, or 30 and bus bars 120.

The supporting plate 110 may have a plate shape having a predetermined area and may fix the at least one electric element 10, 20, or 30 and the bus bars 120 configured to electrically connect the electric elements 10, 20, and 30.

In this case, the supporting plate 110 may have both a heat dissipation property and an insulation property.

That is, in the supporting plate 110, a portion having a heat dissipation property may serve to support the electric elements 10, 20, and 30 and the bus bars 120 and dissipate heat generated when the electric elements are operated. Further, in the supporting plate 110, a portion having an insulation property may prevent an electric short circuit between the bus bars 120 and the electric elements 10, 20, and 30.

The supporting plate 110 may be formed of a plastic material, and according to an embodiment of the present invention, at least a portion of the supporting plate 110 may be formed of the plastic material having a heat dissipation property and an insulation property, and portions of the bus bars 120 may be fixed to the above-described portion having a heat dissipation property and an insulation property to come into contact with each other.

As described above, the supporting plate 110 may be partially formed of the plastic material having a heat dissipation property and an insulation property, but is not limited thereto, and may be entirely formed of the plastic material having a heat dissipation property and an insulation property.

Each of the bus bars 120 may include a first portion 121, a second portion 122, and a third portion 123. In this case, the first portion 121 may be a portion completely buried inside the supporting plate 110, the third portion 123 may be a portion exposed to the outside of the supporting plate 110, and the second portion 122 may be a portion fixed through the supporting plate 110 while connecting the first portion 121 and the third portion 123.

In a case in which the inside and/or portion of the supporting plate 110 includes the portion formed of the plastic material having a heat dissipation property and an insulation property, the first portion 121 of the bus bar 120 may be buried inside the supporting plate 110 to come into contact with the above-described portion formed of the plastic material having a heat dissipation property and an insulation property.

According to a first embodiment of the present invention, as shown in FIGS. 1 to 4, the supporting plate 110 may include a first plate 111, a second plate 112, and a third plate 113 each having a plate shape. In this case, the first plate 111, the second plate 112, and the third plate 113 may be sequentially stacked, and at least the first plate 111 among the first plate 111, the second plate 112, and the third plate 113 may be formed of a plastic material having a heat dissipation property and an insulation property.

Figure 3:
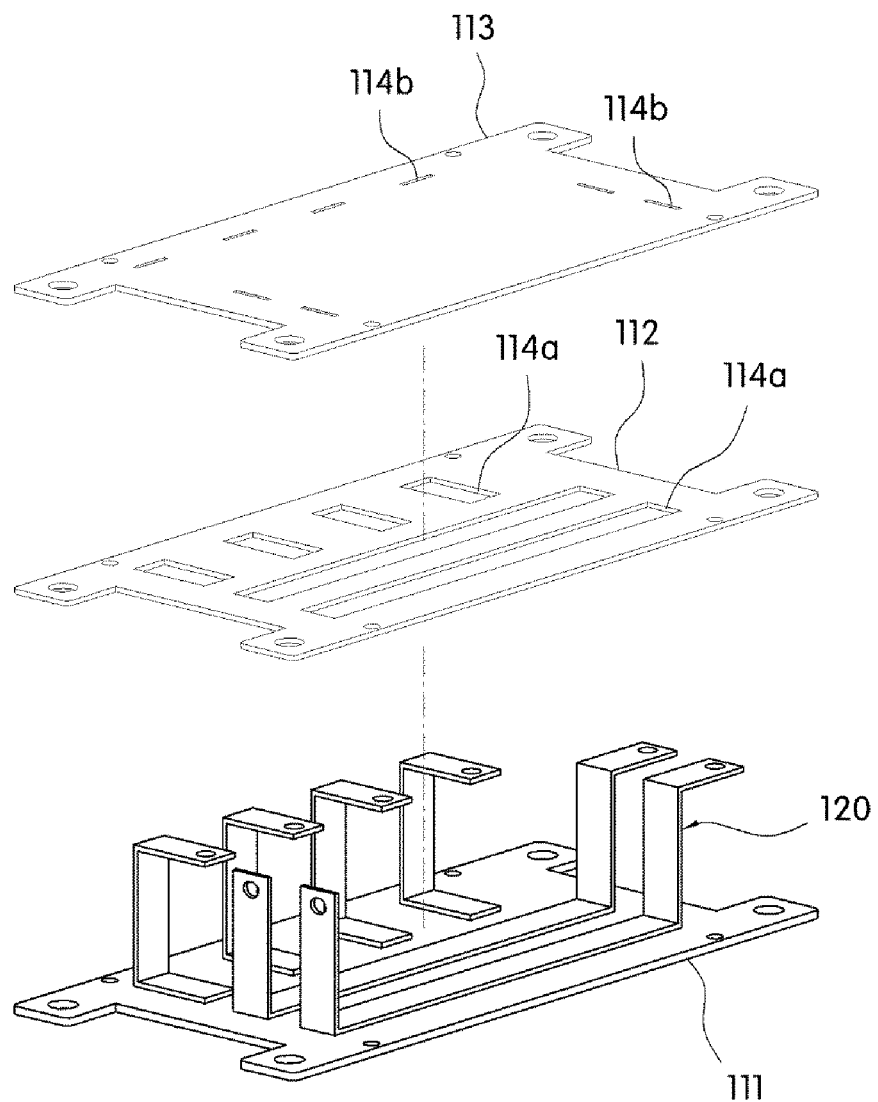
FIG. 3 is a view illustrating a state in which a first plate, a second plate and a third plate are separated in FIG. 2.
Figure 4:
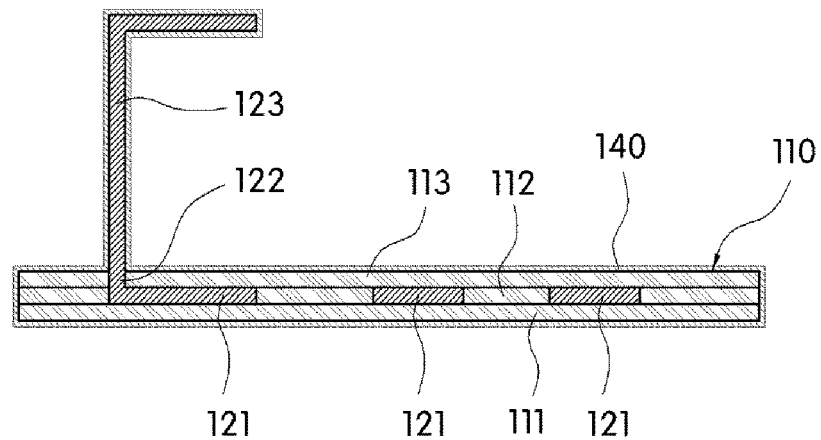
FIG. 4 is a cross-sectional view in a direction A-A in FIG. 2.

In this case, as shown in FIGS. 3 and 4, arrangement holes 114a and 114b having shapes corresponding to the first portion 121 and the second portion 122 of the bus bar 120 buried in the supporting plate 110 may be formed in each of the second plate 112 and the third plate 113 to pass through the bus bars 120. In this case, the shapes of the arrangement holes 114a and 114b may be appropriately changed according to the shapes of the first portion 121 and the second portion 122 of the bus bar 120 buried in the supporting plate 110.

Accordingly, heat generated when the electric elements 10, 20, and 30 and the bus bars 120 are operated may be transferred to the outside after being transferred to the first plate 111 having a heat dissipation property. Further, the bus bar 120 may be fixed by the second plate 112 and the third plate 113 in a state in which the second portion 122 is buried in the supporting plate 110. Accordingly, in the power relay assembly 100 according to the embodiment, since separate fixing members configured to fix the bus bars 120 to the supporting plate 110 are not necessary, space may be efficiently used and the assembly process may be simplified.

Here, the first plate 111, the second plate 112, and the third plate 113 which are sequentially stacked may be attached to each other by an adhesion member (not shown). In this case, although a general adhesion member may be used as the adhesion member, preferably, a heat dissipating adhesion member including a heat conductive filler may be used. Further, the first plate 111, the second plate 112, and the third plate 113 may be attached to each other through a known heat transfer material (not shown) such as a Tim. In addition, the first plate 111, the second plate 112, and the third plate 113 may be in a shape fixed by a fastening member (not shown) such as a bolt member after being sequentially stacked.

Meanwhile, in a case in which the supporting plate 110 is formed to be separated into the first plate 111, the second plate 112, and the third plate 113, the first plate 111 may be formed of the plastic material having a heat dissipation property and an insulation property and the second plate 112 and the third plate 113 may be formed of a general plastic material having an insulation property.

In this case, heat transferred to the first plate 111 having a heat dissipation property through the bus bars 120 may be prevented from being transferred in a vertical direction by the second plate 112 and/or the third plate 113 stacked on upper side of the first plate 111. Accordingly, the heat transferred to the first plate 111 may be prevented to be transferred to the electric elements 10, 20, and 30 through the second plate 112 and/or the third plate 113.

Accordingly, since a dissipation path of heat generated from the bus bars 120 may be concentrated to the first plate 111, the heat dissipation performance may be improved.

Figure 11:
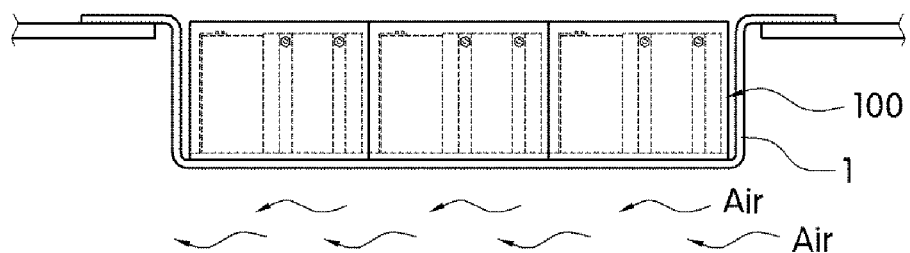
FIG. 11 is a schematic view illustrating a state in which the power relay assembly according to the embodiment of the present invention is mounted on a case of an electric vehicle.
Figure 12:
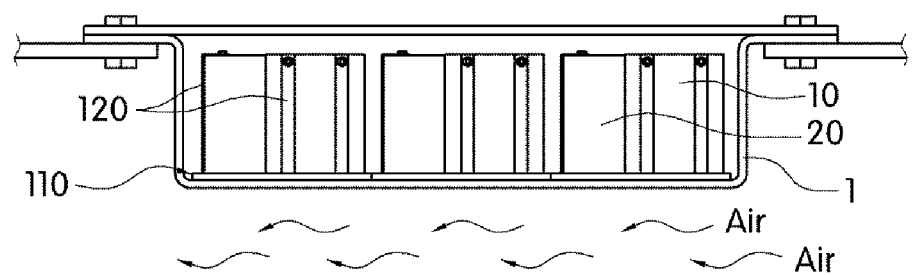
FIG. 12 is a schematic view illustrating a state in which the power relay assembly according to the embodiment of the present invention is mounted on the case of the electric vehicle and sealed by one cover.

Further, as shown in FIGS. 11 and 12, in a case in which external air comes into contact with a lower side of the case 1 in a natural convection manner or a forced convection manner in a state in which one power relay assembly 100 or a plurality of power relay assemblies 100 according to the present invention are disposed in a box-shaped case 1, in the power relay assembly 100, heat generated from the electric elements 10, 20, and 30 and/or the bus bars 120 may be concentrated to the first plate 111 configured to directly come into contact with the case 1 and may thus be more efficiently released.

Meanwhile, in a case in which the supporting plate 110 is formed to be separated into the first plate 111, the second plate 112, and the third plate 113, the second plate 112 and the third plate 113 may be formed of a plastic material having a heat dissipation property and an insulation property like the first plate 111. That is, the supporting plate 110 may be entirely formed of a plastic material having a heat dissipation property. In this case, in the supporting plate 110, since the overall heat capacity increases, the heat dissipation performance may be further improved in comparison with when only the first plate 111 is formed of the plastic material having a heat dissipation property and an insulation property.

Figure 5:
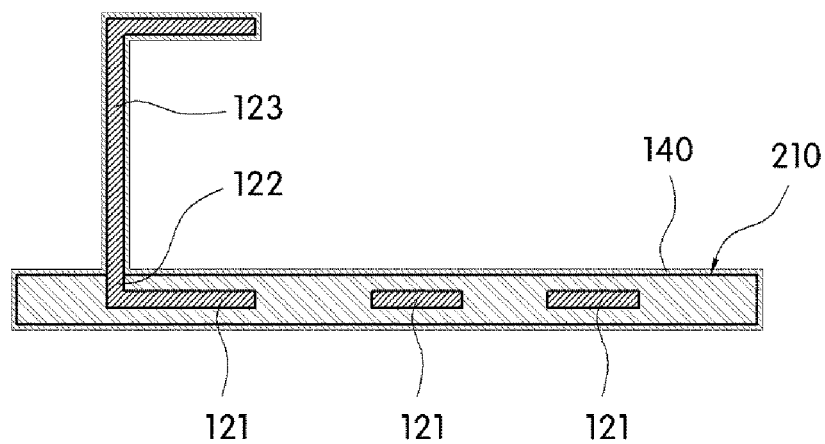
FIGS. 5 to 9 are views illustrating various shapes of a supporting plate applicable to the power relay assembly according to the embodiment of the present invention, and are cross-sectional views of the supporting plate viewed from the same direction as that in FIG. 4.

According to a second embodiment of the present invention, as shown in FIG. 5, a supporting plate 210 may be a molding product formed of a resin-forming composition having a heat dissipation property and an insulation property.

That is, the supporting plate 210 may be entirely formed of a plastic material having a heat dissipation property and an insulation property and the bus bar 120 may be integrally formed with the supporting plate 210. Here, at least a portion of the bus bar 120 may be integrated with the supporting plate 210 in a shape buried in the resin-forming composition in a process of molding the supporting plate 210 through insert-molding using the resin-forming composition, and may have a shape in which the first portion 121 and the second portion 122 are buried in the supporting plate 210.

Accordingly, the supporting plate 210 according to the second embodiment of the present invention is formed to be separated into the first plate 111, the second plate 112, and the third plate 113 as described above and may further improve the heat dissipation performance by increasing the overall heat capacity like the supporting plate 110 of the first embodiment in which all of the first plate 111, the second plate 112, and the third plate 113 are formed of the plastic material having a heat dissipation property and an insulation property, and since a cumbersome assembly process is not included, work productivity may be improved.

As another example, as shown in FIGS. 6 to 9, each of supporting plates 310, 410, 510, and 610 according to third to sixth embodiments may include a plate-shaped metal member 150 having a predetermined area to maintain the heat dissipation performance and improve mechanical strength. In this case, the metal member 150 may have a shape entirely buried in each of the supporting plates 310, 410, 510, and 610 or may a shape which is a portion of the metal member 150 is buried in each of the supporting plates 310, 410, 510, and 610. Further, the metal member 150 may be buried in a portion formed of a plastic material having a heat dissipation property and an insulation property in each of the supporting plates 310, 410, 510, and 610.

Accordingly, each of the supporting plates 310, 410, 510, and 610 may reinforce the mechanical strength through the metal member 150 and implement a desired heat dissipation performance. Further, since the mechanical strength of each of the supporting plates 310, 410, 510, and 610 may be improved through the metal member 150, each of the supporting plates 310, 410, 510, and 610 may have a small thickness.

The above-described metal member 150 may have a shape integrated with the portion formed of the plastic material having a heat dissipation property and an insulation property in each of the supporting plates 310, 410, 510, and 610 through insert injection-molding.

In the present invention, the metal member 150 may be used without limitation in the case of a metal material having a predetermined heat conductivity. As an unlimited example, the metal member 150 may be one metal selected from the group consisting of aluminum, magnesium, iron, titanium, and copper or an alloy including at least one metal.

Figure 6:
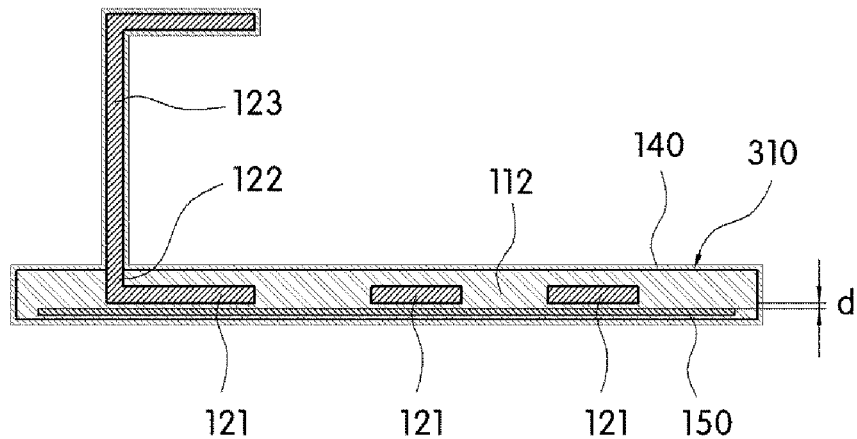
Figure 8:
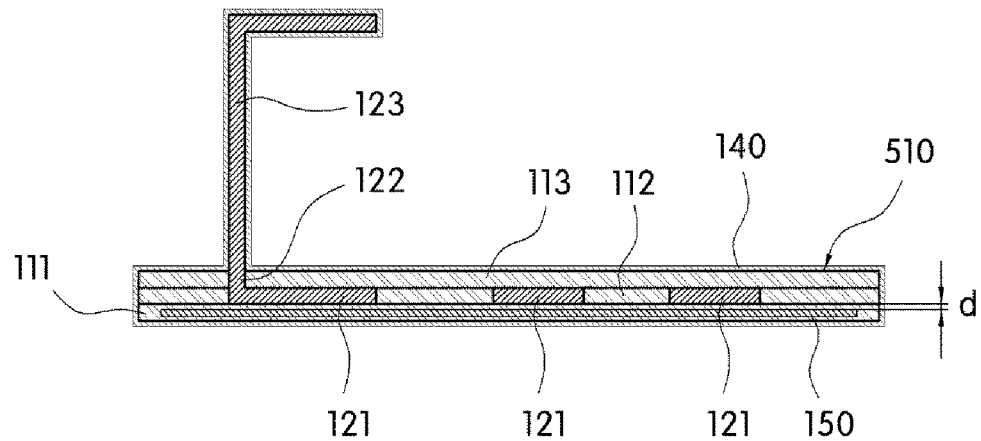

In each of the supporting plates 310 and 510 of the third and fifth embodiments shown in FIGS. 6 and 8, the metal member 150 may be buried inside the supporting plates 310 and 510 so that all the surfaces of the metal member are completely surrounded by the portion formed of the plastic material having a heat dissipation property and an insulation property.

Figure 7:
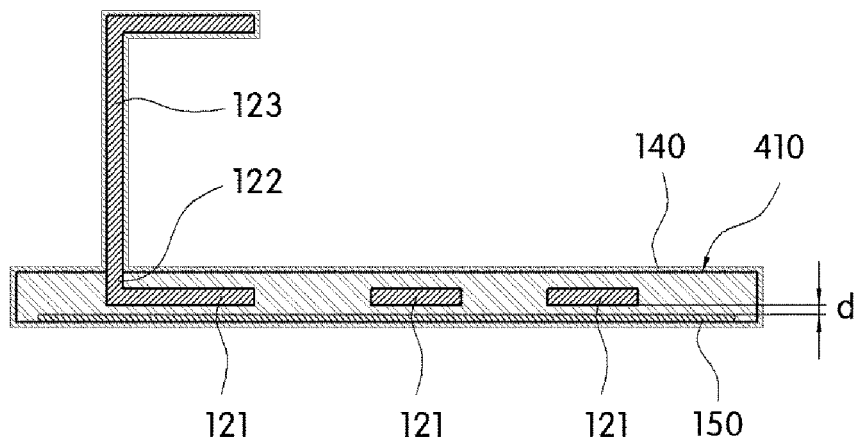
Figure 9:
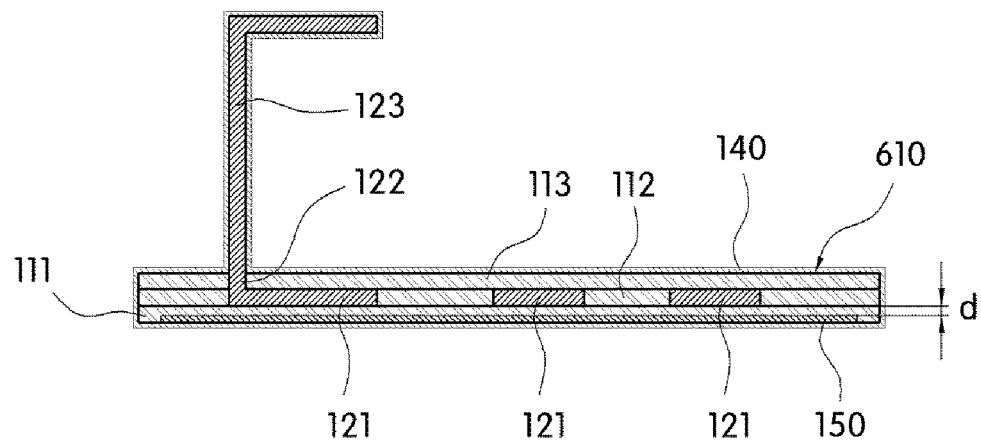

Further, in each of the supporting plates 410 and 610 of the fourth and sixth embodiments shown in FIGS. 7 and 9, the metal member 150 may be disposed on one surface of each of the supporting plates 410 and 610 to come into contact with portions formed of the plastic material having a heat dissipation property and an insulation property, and expose one surface thereof to the outside.

In this case, the metal member 150 may be surface-treated so that an interface with the portion formed of the plastic material having a heat dissipation property and an insulation property is not separated after insert-molding. Accordingly, the supporting plates 310, 410, 510, and 610 may increase a coupling force between the metal member 150 and the portion formed of the plastic material having a heat dissipation property and an insulation property.

Alternatively, a nano-sized fine groove may be formed in a predetermined pattern on at least one surface of the metal member 150 to improve bonding strength between the metal member 150 and the portion formed of the plastic material having a heat dissipation property and an insulation property.

Meanwhile, as described above, in a case in which each of the supporting plates 310, 410, 510, and 610 according to the third to sixth embodiments includes the metal member 150, the metal member 150 may be disposed to maintain a predetermined interval d from an end portion of the bus bar 120 at least partially buried in each of the supporting plates 310, 410, 510, and 610. That is, the metal member 150 may be partially or entirely buried in each of the supporting plates 310, 410, 510, and 610 while the metal member 150 maintains the predetermined interval d with a lower side of the first portion 121 of the bus bar 120.

As a specific example, a spacing distance d between the metal member 150 and the first portion 121 of the bus bar 120 may have an interval of 1 mm or more, to maintain an insulation property and satisfy a desired withstand voltage property.

In the present invention, as described above, the metal member 150 may be a plate-shaped metal plate having a predetermined area. However, the metal member 150 is not limited thereto, and may be provided in a bar shape having a predetermined aspect ratio. Further, the metal member 150 may have a mesh type having a closed loop-shaped edge such as a quadrangular or circular-shaped edge and in which a plurality of wires or bars are disposed to be spaced apart from each other at a predetermined interval on the inside of the edge. In a case in which the metal member 150 has the mesh type, the plurality of wires or bars disposed on the inside of the edge may be disposed to form a parallel structure, a lattice structure, a honeycomb structure, and various structures in which the above are combined.

Meanwhile, the plastic having a heat dissipation property and an insulation property used to configure the supporting plates 110, 210, 310, 410, 510, and 610 according to the first to sixth embodiments of the present invention may have a shape in which insulating heat dissipation fillers are dispersed on a polymer matrix.

As an example, the polymer matrix may be used without limitation when implemented into a polymer compound which does not hinder the dispersibility of the heat dissipation fillers and is injection-moldable. As a specific example, the polymer matrix may be a known thermoplastic polymer compound and the thermoplastic polymer compound may be a compound selected from the group consisting of polyamide, polyester, polyketone, a liquid crystal polymer, polyolefin, polyphenylene sulfide (PPS), polyether ether ketone (PEEK), polyphenylene oxide (PPO), polyethersulfone (PES), polyetherimide (PEI), and polyimide, or a mixture or copolymer of at least two among the above group.

Further, all the insulating heat dissipation fillers having both an insulation property and a heat dissipation property may be used without limitation. As a specific example, the insulating heat dissipation filler may include at least one selected from the group consisting of magnesium oxide, titanium dioxide, aluminum nitride, silicon nitride, boron nitride, aluminum oxide, silica, zinc oxide, barium titanate, strontium titanate, beryllium oxide, silicon carbide, and manganese oxide.

Further, the insulating heat dissipation filler may be porous or nonporous, and may also be a core shell type filler in which a known conductive heat dissipation filler such as a carbon-based filler, a metal filler, or the like is used as a core and insulating ingredients surround the core.

In addition, in the case of the insulating heat dissipation filler, a surface may be modified with a functional group such as a silane group, an amino group, a hydroxyl group, a carboxyl group, or the like to improve the surface bonding strength with the polymer matrix by improving wettability or the like.

However, the plastic having an insulation property and a heat dissipation property useable in the present invention is not limited thereto and all plastics having both an insulation property and a heat dissipation property may be used without limitation.

The plurality of electric elements 10, 20, and 30 may be mounted on one surface of the supporting plate 110 and may be electrically connected to each other through the bus bar 120. Accordingly, the electric elements 10, 20, and 30 may serve to block or connect the high-voltage currents supplied from the battery to the driving control part.

The above-described electric elements 10, 20, and 30 may be main relays, pre-charge relays, pre-charge resistors, battery current sensors, main fuses, and the like and may be electrically connected to each other through the bus bar 120 or a cable (not shown). Further, the plurality of bus bars 120 may be electrically connected to each other through circuit patterns (not shown) formed on the supporting plates 110, 210, 310, 410, 510, and 610.

Accordingly, the electric elements 10, 20, and 30 may supply power to the driving control part (not shown) configured to control a driving voltage by blocking or connecting the high-voltage currents supplied from the battery to generate control signals for driving a motor in the driving control part. In these circumstances, the driving control part may generate control signals for driving the motor, and since an inverter and a converter are controlled through the control signals, driving of the motor may be controlled.

As an example, since the main relays adopt a connected state and the pre-charge relays are blocked when a vehicle is driven, the power from the battery may be applied to the inverter through a main circuit.

Further, since the main relays adopt a blocked state and connection between the battery and the inverter is blocked when the vehicle is turned off, a battery voltage may be prevented from being transferred to the motor through the inverter. In this case, when the main relays are blocked, a condenser connected to the inverter may be discharged.

Further, when the vehicle is driven again, since the pre-charge relays are connected and thus the battery voltage is applied to the inverter in a lowered state by a pre-charge resistor, charging of the condenser may be started. In addition, when the condenser is sufficiently charged, since the main relays are connected and the pre-charge relays are blocked, the battery voltage may be applied to the inverter.

Since the operation of the above-described electric elements is publically known, detailed descriptions thereof will not be provided.

The bus bars 120 may electrically connect the plurality of electric elements mounted on one surfaces of the above-described supporting plates 110, 210, 310, 410, 510, and 610 according to the first to sixth embodiments.

To this end, the bus bars 120 may be formed of conductors having low impedance and a large current capacity, and may serve to separately connect at least two electric elements or connect various isoquant points to distribute the power to various positions.

The above-described bus bar 120 may be provided in a plate-shaped bar shape having a predetermined length. Further, the bus bar 120 may have a shape in which a portion of the entire length is bent once or plural times to be easily fastened to the electric elements 10, 20, and 30. However, the overall shape of the bus bar 120 is not limited to the above and may be appropriately changed according to arrangement locations of the electric elements 10, 20, and 30 that are desired to be connected to each other.

In this case, as described above, at least a portion of the bus bar 120 may be buried in each of the supporting plates 110, 210, 310, 410, 510, and 610 according to the first to sixth embodiments.

In the description of the supporting plate 110 according to the first embodiment of the present invention as a specific example, as shown in FIG. 4, the bus bar 120 may include the first portion 121 buried in the supporting plate 110 and extending portions 122 and 123 configured to extend from an end portion of the first portion 121.

Further, from the entire length, the extending portions 122 and 123 may include the second portion 122 configured to extend from an end portion of the first portion 121 in a thickness direction of the supporting plate 110 and the third portion 123 configured to extend from an end portion of the second portion 122 to protrude toward the outside of the supporting plate 110, and the second portion 122 may be buried in the supporting plate 110 together with the first portion 121.

Here, the first portion 121 and the second portion 122 buried in the supporting plate 110 may be disposed at the arrangement holes 114a and 114b formed to pass through the second plate 112 and the third plate 113 in a case in which the supporting plate 110 is implemented in a shape on which the first plate 111, the second plate 112, and the third plate 113 are stacked.

Accordingly, an upper surface of the first portion 121 buried in the supporting plate 110 may be covered by the third plate 113 in a state in which a lower surface of the first portion 121 comes into contact with the first plate 111, and in a case in which the first plate 111, the second plate 112, and the third plate 113 are fix-coupled, the first portion 121 may be fixed through the second plate 112 and the third plate 113. Accordingly, the bus bars 120 may be fixed to the supporting plate 110 even when separate fixing members are not used.

Further, at least the first portion 121 among the first portion 121 and the second portion 122 buried in the supporting plate 110 may be disposed to directly come into contact with the first plate 111 formed of the plastic material having a heat dissipation property and an insulation property.

Accordingly, since heat generated when the electric elements 10, 20, and 30 and the bus bars 120 are operated may be easily released to the outside after being transferred to the first plate 111 of formed of the plastic material having a heat dissipation property and an insulation property, performance degradation and damage of components due to heat may be prevented.

The extending portions 122 and 123 configured to extend from the first portion 121 are shown as only one in the drawings but the invention is not limited thereto, and a plurality of extending portions 122 and a 123 may be provided.

Meanwhile, known heat transfer materials (not shown) may be provided on outer surfaces of the first portion 121 and the second portion 122 of the bus bar 120 buried in each of the supporting plates 110, 210, 310, 410, 510, and 610 according to the first to sixth embodiments of the present invention. The heat transfer materials may easily transfer the heat in the bus bars 120 to the supporting plates 110, 210, 310, 410, 510, and 610 having a heat dissipation property.

A plurality of bus bars 120 may be provided. Further, at least some of the plurality of bus bars 120 may be connected to plus and minus terminals of the battery and plus and minus terminals of the inverter. Accordingly, the plurality of electric elements 10, 20, and 30 may block or connect the high-voltage currents supplied from the battery to the driving control part.

Meanwhile, the power relay assembly 100 according to the embodiment of the present invention may further include a protection coating layer 140.

As shown in FIG. 4, the protection coating layer 140 may be coated to cover all outer surfaces of the supporting plate 110 according to the first embodiment of present invention and the bus bars 120. Further, the protection coating layer 140 may also cover all outer surfaces of the electric elements 10, 20, and 30 mounted on one surface of the supporting plate 110. However, the coated location of the protection coating layer 140 is not limited thereto, and the protection coating layer 140 may be coated on only the outer surface of the supporting plate 110 and coated on only the outer surfaces of the bus bars 120. Further, the protection coating layer 140 may be identically coated to the supporting plates 210, 310, 410, 510, and 610 according to the second to sixth embodiments of the present invention.

The above-described protection coating layer 140 may prevent scratches due to physical stimuli applied to surfaces of the supporting plates 110, 210, 310, 410, 510, and 610 and the bus bars 120 and further improve an insulation property of the surfaces.

Further, in a case in which the supporting plates 110, 210, 310, 410, 510, and 610 according to the first to sixth embodiments are formed of plastic on which the insulating heat dissipation fillers are dispersed, the protection coating layer 140 may serve to prevent separation of the insulating heat dissipation fillers located on the surface thereof.

As an example, the protection coating layer 140 may be implemented into a known thermosetting polymer compound or a thermoplastic polymer compound. The thermosetting polymer compound may be a compound selected from the group consisting of an epoxy-based resin, a urethane-based resin, an ester-based resin, and a polyimide-based resin, or a mixture or copolymer of at least two in the above group. Further, the thermoplastic polymer compound may be a compound selected from the group consisting of polyamide, polyester, polyketone, a liquid crystal polymer, polyolefin, polyphenylene sulfide (PPS), polyether ether ketone (PEEK), polyphenylene oxide (PPO), polyethersulfone (PES), polyetherimide (PEI), and polyimide or a mixture or copolymer of at least two among the above group, but the present invention is not be limited thereto.

Meanwhile, since the protection coating layer 140 may be coated on outer surfaces of the supporting plates 110, 210, 310, 410, 510, and 610 according to the first to sixth embodiments, the protection coating layer 140 can interfere with the dissipation of the heat transferred to the supporting plate 110. To solve this problem, the protection coating layer 140 applied to the present invention may further include insulating heat dissipation fillers to improve the characteristic of dissipating heat to the outside. The insulating heat dissipation fillers may be used without limitation in the case of the known insulating heat dissipation fillers.

As an example, the protection coating layer 140 may include insulating heat dissipation fillers dispersed on the polymer matrix to have both a heat dissipation property and an insulation property like the above-described supporting plates 110, 210, 310, 410, 510, and 610 according to the first to sixth embodiments.

In this case, the insulating heat dissipation fillers included in the protection coating layer 140 may be the same as the insulating heat dissipation fillers included in the supporting plates 110, 210, 310, 410, 510, and 610 and different from the insulating heat dissipation fillers included in the supporting plates 110, 210, 310, 410, 510, and 610.

The bus bars 120, as described above, may be formed of a conductor having low impedance and a large current capacity. As a specific example, the bus bars 120 may be formed of a metal material such as copper or aluminum.

Figure 10:
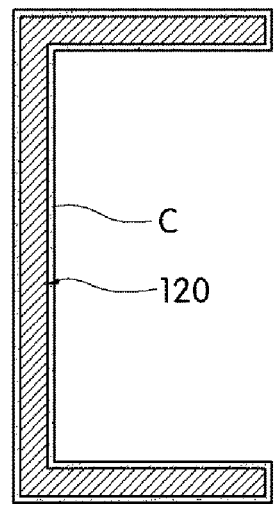
FIG. 10 is a cross-sectional view illustrating the bus bars applicable to the power relay assembly according to the embodiment of the present invention, and illustrates a coating layer formed on a surface.

Here, in a case in which the bus bars 120 are formed of an aluminum material, as shown in FIG. 10, each of the bus bars 120 may have a shape in which a heat dissipation coating layer C is formed on surfaces thereof and the heat dissipation coating layer C may be the same as the above-described protection coating layer 140 including the insulating heat dissipation fillers. That is, in a case in which the bus bars 120 are formed of an aluminum material, the bus bar 120 may have a less weight than the bus bar 120 formed of copper material because aluminum has a less specific gravity than copper, due to the characteristics of the materials. Accordingly, the power relay assembly in which aluminum is used for the material of the bus bars 120 may have a much less weight than the power relay assembly in which copper is used for the material of the bus bars 120.

On the other hand, since aluminum has a lower heat conductivity than copper, due to the characteristics of the materials, the bus bar formed of aluminum may have inferior heat dissipation performance in a case in which both are manufactured in the same size and should be manufactured in a large thickness to implement heat dissipation performance similar to that of the bus bar made of copper.

In the present invention, to solve this problem, in a case in which the bus bars 120 are formed of an aluminum material, the heat dissipation coating layer C including the insulating heat dissipation fillers may be formed on the surface of the bus bar 120 to supplement the heat dissipation performance, and thus similar heat dissipation performance may be implemented and the thickness may minimally increase in comparison with when the bus bars are formed of a copper material.

Accordingly, the power relay assembly in which aluminum is used for the material of the bus bars 120 may be lightened in comparison with the power relay assembly in which copper is used for the material of the bus bars 120, and manufacturing costs may be reduced.

As an unlimited example, the bus bar formed of an aluminum material may have a thickness about 1.5 times that of the bus bar formed of a copper material having the same shape to implement similar heat dissipation performance. However, in a case in which the heat dissipation coating layer C including the insulating heat dissipation fillers is formed on the surface of the bus bar, the bus bar formed of an aluminum material and having the heat dissipation coating layer C including the insulating heat dissipation fillers formed on the surface thereof may implement a heat dissipation performance similar to that of the bus bar formed of a copper material even when having a thickness 1.3 times that of the bus bar formed of a copper material.

However, the material used for the bus bar 120 is not limited thereto and is not limited for a conductor having low impedance and a large current capacity.

Meanwhile, as shown in FIG. 1, the power relay assembly 100 according to the embodiment of the present invention may further include at least one cover 130 to prevent exposure of the electric elements 10, 20, and 30 and the bus bars 120 configured to protrude from one surface of each of the supporting plates 110, 210, 310, 410, 510, and 610 to the outside and protect the electric elements 10, 20, and 30 and the bus bars 120 from the external environment.

The above-described cover 130 may be directly fastened to the supporting plates 110, 210, 310, 410, 510, and 610 according to the first to sixth embodiments and may be fastened to brackets (not shown) separately provided on edges of the supporting plates 110, 210, 310, 410, 510, and 610. Further, the cover 130 may have a box shape of which one side is open, but is not limited thereto, and the cover may be formed of one member, and a plurality of components may be assembled to each other to configure one box. Further, as shown in FIGS. 1 and 11, the cover 130 may respectively cover one the supporting plates 110, 210, 310, 410, 510, or 610, and as shown in FIG. 12, the cover 130 may have a shape which simultaneously covers the plurality of supporting plates 110, 210, 310, 410, 510, and 610 disposed adjacent to each other.

In addition, the cover 130 may be formed of a general plastic material having an insulation property but may also include at least a portion formed of a plastic material having a heat dissipation property and an insulation property like the supporting plates 110, 210, 310, 410, 510, and 610 according to the first to sixth embodiments.

Although one embodiment of the present invention is described above, the spirit of the present invention is not limited to the embodiment shown in the description, and although those skilled in the art may provide other embodiments through the addition, change, or removal of the components within the scope of the same spirit of the present invention, such embodiments are also included in the scope of the spirit of the present invention.

The invention claimed is:

1. A power relay assembly comprising:
   a supporting plate having at least one electric element mounted on one surface thereof and formed entirely of a plastic material having a high heat dissipation property and a high electrical insulation property; and
   at least one bus bar electrically connected to the at least one electric element and including a portion thereof buried in the supporting plate,
   wherein the at least one bus bar includes a first portion buried in and fixed by the supporting plate, a second portion configured to extend a predetermined length from an end portion of the first portion along a thickness direction of the supporting plate and buried in and fixed by the supporting plate, and a third portion configured to extend from the second portion to protrude toward an outer side of the supporting plate and fastened to the at least one electric element,
   wherein the first portion and the second portion of the at least one bus bar are not exposed to an outside of the supporting plate and are buried inside the supporting plate so that the at least one bus bar is fixed by the supporting plate,
   wherein heat transferred from the at least one electric element to the at least one bus bar is transferred to an inner side of the supporting plate in which the first and second portions of the at least one bus bar are buried, and then is discharged to the outside through the entire supporting plate, wherein the supporting plate further includes a plate-shaped metal member disposed to be spaced apart from a lower side of the portion of the at least one bus bar buried in the supporting plate at an interval, wherein the metal member is disposed to be completely buried inside the supporting plate, wherein the supporting plate is integrated with the first portion and the second portion of the at least one bus bar and the metal member buried therein through a resin-forming composition having a high heat dissipation property and a high electrical insulation property and formed by insert-molding, and wherein the first portion and the second portion of the at least one bus bar, and the metal member, are each, respectively, integrated with the supporting plate in a shape buried in the resin forming composition in a process of molding the supporting plate through insert-molding using the resin-forming composition.

2. The power relay assembly of claim 1, wherein the at least one bus bar is disposed so that at least a portion of the portion buried in the supporting plate comes into contact with a portion of the supporting plate formed of the plastic material having a high heat dissipation property and a high electrical insulation property.

3. The power relay assembly of claim 1, wherein the metal member is disposed on the supporting plate to have an interval of greater than or equal to 1 mm from the portion of the at least one bus bar buried in the supporting plate.

4. The power relay assembly of claim 1, wherein a coating layer having a high electrical insulation property and a high heat dissipation property is formed on an exposed surface thereof.

5. The power relay assembly of claim 1, wherein the at least one bus bar is formed of an aluminum material and includes a coating layer having a high electrical insulation property and a high heat dissipation property formed on a surface thereof.

6. The power relay assembly of claim 1, comprising at least one cover configured to prevent exposure of the at least one bus bar to the outside, wherein the cover is formed of a plastic material having a high heat dissipation property and a high electrical insulation property.

* * * * *